United States Patent
Lagally et al.

(10) Patent No.: US 11,201,028 B2
(45) Date of Patent: Dec. 14, 2021

(54) TRAVELING WAVE TUBE AMPLIFIER HAVING A HELICAL SLOW-WAVE STRUCTURE SUPPORTED BY A CYLINDRICAL SCAFFOLD

(71) Applicant: Wisconsin Alumni Research Foundation, Madison, WI (US)

(72) Inventors: Max G. Lagally, Madison, WI (US); Matthew McLean Dwyer, Madison, WI (US); Francesca Cavallo, Albuquerque, NM (US); Daniel Warren van der Weide, Madison, WA (US); Abhishek Bhat, Madison, WI (US)

(73) Assignees: Wisconsin Alumni Research Foundation, Madison, WI (US); The Regents of the University of New Mexico, Albuquerque, NM (US)

( * ) Notice: Subject to any disclaimer, the term of this patent is extended or adjusted under 35 U.S.C. 154(b) by 0 days.

(21) Appl. No.: 16/589,348

(22) Filed: Oct. 1, 2019

(65) Prior Publication Data

US 2021/0099142 A1    Apr. 1, 2021

(51) Int. Cl.
| | |
|---|---|
| H01J 23/26 | (2006.01) |
| H03F 3/58 | (2006.01) |
| H01J 25/44 | (2006.01) |
| H01J 9/14 | (2006.01) |
| H01J 23/24 | (2006.01) |
| H01J 25/34 | (2006.01) |

(52) U.S. Cl.
CPC .............. *H01J 23/26* (2013.01); *H01J 9/14* (2013.01); *H01J 23/24* (2013.01); *H01J 25/34* (2013.01); *H01J 25/44* (2013.01); *H03F 3/58* (2013.01); *H01J 2209/012* (2013.01)

(58) Field of Classification Search
CPC ............. H01J 23/24; H01J 23/26; H01J 25/34
USPC ......................................................... 315/3.5
See application file for complete search history.

(56) References Cited

U.S. PATENT DOCUMENTS

| | | | |
|---|---|---|---|
| 3,916,246 A | 10/1975 | Preist | |
| 4,571,524 A | 2/1986 | Mourier | |
| 4,820,688 A | 4/1989 | Jasper | |
| 5,112,438 A * | 5/1992 | Bowers | H01J 23/165 |
| | | | 204/192.17 |
| 5,231,330 A * | 7/1993 | Karsten | H01J 23/165 |
| | | | 29/600 |
| 6,917,162 B2 | 7/2005 | Dayton | |
| 7,707,714 B2 | 5/2010 | Schmidt et al. | |
| 8,847,490 B2 | 9/2014 | Dayton et al. | |
| 8,884,519 B2 | 11/2014 | Dayton et al. | |

(Continued)

OTHER PUBLICATIONS

Prinz et al., Terahertz metamaterials and systems based on rolled-up 3D elements: designs, technological approaches, and properties—Scientific reports, 2017—nature.com, pp. 1-15.

(Continued)

*Primary Examiner* — Benny T Lee
(74) *Attorney, Agent, or Firm* — Bell & Manning, LLC

(57) ABSTRACT

Traveling-wave tube amplifiers for high-frequency signals, including terahertz signals, and methods for making a slow-wave structure for the traveling-wave tube amplifiers are provided. The slow-wave structures include helical conductors that are self-assembled via the release and relaxation of strained films from a sacrificial growth substrate.

14 Claims, 12 Drawing Sheets

(56) References Cited

U.S. PATENT DOCUMENTS

| | | |
|---|---|---|
| 9,777,384 B2 | 10/2017 | Joye |
| 2003/0151366 A1 | 8/2003 | Dayton, Jr. |
| 2006/0057504 A1 | 3/2006 | Sadwick et al. |
| 2012/0286657 A1* | 11/2012 | Chua et al. ............. H01J 25/34 315/3.5 |
| 2016/0099127 A1* | 4/2016 | Aditya et al. ........... H01J 23/28 315/39 |
| 2017/0207522 A1 | 7/2017 | Li et al. |
| 2019/0279834 A1 | 9/2019 | Van der weide et al. |

OTHER PUBLICATIONS

Huang et al., "On-Chip Inductors with Self-Rolled-Up SiNx Nanomembrane Tubes: A Novel Design Platform for Extreme Miniaturization," Nano letters, 2012—ACS Publications, pp. 6283-6288.

Ren, Zheng, and Pu-Xian Gao. "A review of helical nanostructures: growth theories, synthesis strategies and properties." Nanoscale 6.16 (2014): 9366-9400.

Dayton, James A., et al. "Diamond-studded helical traveling wave tube." *IEEE Transactions on Electron Devices* 52.5 (2005): 695-701.

Lueck, M. R., et al. "Microfabrication of diamond-based slow-wave circuits for mm-wave and THz vacuum electronic sources." Journal of Micromechanics and Microengineering 21.6 (2011): 065022.

Tian et al., "Anisotropic rolling and Controlled Chirality of Nanocrystalline Diamond Nanomembranes toward Biomimetic Helical Frameworks," Nano Lett. 2018, 18, pp. 3688-3694.

Froeter et al., "3-D hierarchical architectures based on self-rolled-up silicon nitride membranes," Nanotechnology 24, 2013, 9 pages.

Bell et al, "Directed batch assembly of three-dimensional helical Inanobelts through angular winding and electroplating," Institute of Physics Publishing, Nanotechnology 18 (2007) 055304 (5pp).

\* cited by examiner

TRAVELING WAVE TUBE AMPLIFIER HAVING A HELICAL SLOW-WAVE STRUCTURE SUPPORTED BY A CYLINDRICAL SCAFFOLD

REFERENCE TO GOVERNMENT RIGHTS

This invention was made with government support under DE-FG02-03ER46028 awarded by the US Department of Energy and under FA9550-19-1-0086 awarded by the USAF/AFOSR. The government has certain rights in the invention.

BACKGROUND

A traveling wave tube (TWT) is a beam-wave structure enabling interaction between an energetic beam of electrons and an electromagnetic (EM) wave to transfer energy from the electron beam to the EM wave for amplification. TWTs are used as compact, high-gain, high-power sources of high-frequency radiation in applications such as wireless communications, biomedical imaging, and radar. Central to the amplification process is a slow-wave structure (SWS) that matches the phase velocity of the EM wave to that of the electron beam; this structure is some form of meander transmission line or, more commonly, a conductive helix. The slow-wave structure conducts the traveling EM wave along a pathway whose total length is greater than the axial dimension along which the electron beam travels; thus, the component of the EM wave velocity along the axial dimension matches that of the electron beam.

Conventional TWT structures use a wire helix whose dimensions are limited by the smallest gauge wire available, the ability to wind the helix with precision, the ability to support the helix to keep it aligned with the electron beam, and the ability to handle and assemble the helix into the structure. Other methods for manufacturing helical SWSs rely on high-precision laser manufacturing and wafer bonding. Unfortunately, these methods are not easily scalable to micro-scale dimensions (and thus higher frequencies) and are not mass-producible on inexpensive and large-area substrates.

SUMMARY OF THE INVENTION

TWT amplifiers and methods for making SWSs for TWT amplifiers are provided.

One embodiment of a traveling wave tube amplifier includes a slow-wave structure that includes: a cylindrical scaffold comprising a dielectric film, the cylindrical scaffold having an interior surface; and an electrically conductive helix on the interior surface of the cylindrical scaffold, the electrically conductive helix comprising a plurality of electrically conductive strips connected end-to-end; an electron gun positioned to direct one or more beams of electrons axially through the electrically conductive helix or around the periphery of the electrically conductive helix; and an electron collector positioned opposite the electron beam source.

One embodiment of a method of making a slow-wave structure includes the steps of: forming a dielectric support membrane on a device substrate; forming a sacrificial film on a portion of a surface of the dielectric support membrane; forming a scaffold film comprising a strained dielectric material on a portion of a surface of the sacrificial film; forming a plurality of parallel, electrically conductive strips on the scaffold film, each of the electrically conductive strips having a leading end and a trailing end, wherein an edge of the scaffold film or the trailing ends of the electrically conductive strips are attached to the dielectric support membrane; selectively removing the sacrificial film underlying the scaffold film, wherein the scaffold film relaxes and rolls into a cylinder, bringing the electrically conducting strips into an end-to-end arrangement that forms a helix on an interior surface of the cylinder; electroplating the surface of the helix with an electrically conductive material; forming a first electrically conductive contact in electrical communication with a first end of the helix; and forming a second electrically conductive contact in electrical communication with the second end of the helix.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 2A-2K illustrate one embodiment of a method for fabricating a SWS for a TWT amplifier.

DETAILED DESCRIPTION OF THE INVENTION

TWT amplifiers and methods for making SWSs for TWT amplifiers are provided. The SWSs include helical conductors that are self-assembled via the release and relaxation of strained films from a sacrificial growth substrate. The self-assembly methods enable wafer-level fabrication of SWSs having very small diameters, including micron-scale diameters that enable the amplification of terahertz signals.

Figure 1:
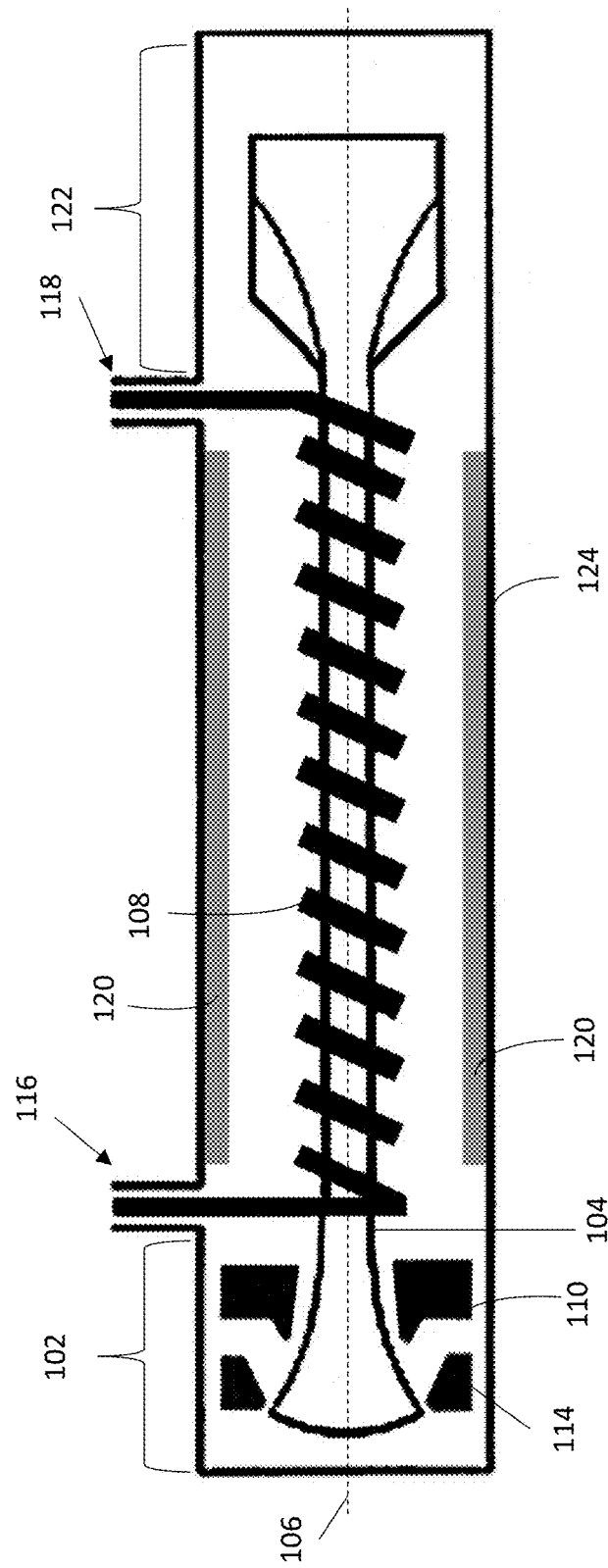
FIG. 1 is a schematic diagram of one embodiment of a TWT amplifier.

The basic components of one embodiment of a TWT amplifier are shown in FIG. 1. The components include an electron gun 102, positioned to direct an electron beam 104 along an axis 106 through an SWS comprising an electrically conductive helix 108 that spirals around axis 106. Electron gun 102 is composed of a control anode 110, a control grid knot shown), and a cathode 114. The TWT amplifier further includes a signal input coupler 116 that introduces an EM signal into helix 108 and a signal output coupler 118 that receives the amplified EM signal from helix 108. Steering magnets 120 or electric fields are arranged around helix 108 to focus and steer electron beam 104, and an electron collector 122 is positioned along axis 106, opposite electron gun 102, to remove the unused electron beam energy. Helix 108 is housed in a vacuum housing 124. An attenuator (not shown) may also be provided along the path of the electron beam to isolate the input and output.

When electron beam 104 is emitted from electron gun 102 and accelerated toward electron collector 122, the electrons are in close proximity to the propagating EM wave. The electron beam is directed along the axis of the helix either through the center of the helix or outside of the helix. In some embodiments, multiple electron beams ("beamlets") are used. These beamlets are directed in circular pattern around the periphery of the helix. The conductive helix slows the axial phase velocity of the EM wave to, or below, the speed of the electrons in the beam. The kinetic energy in the electron beam is coupled into the EM wave, thereby amplifying the EM wave.

Figure 2A:
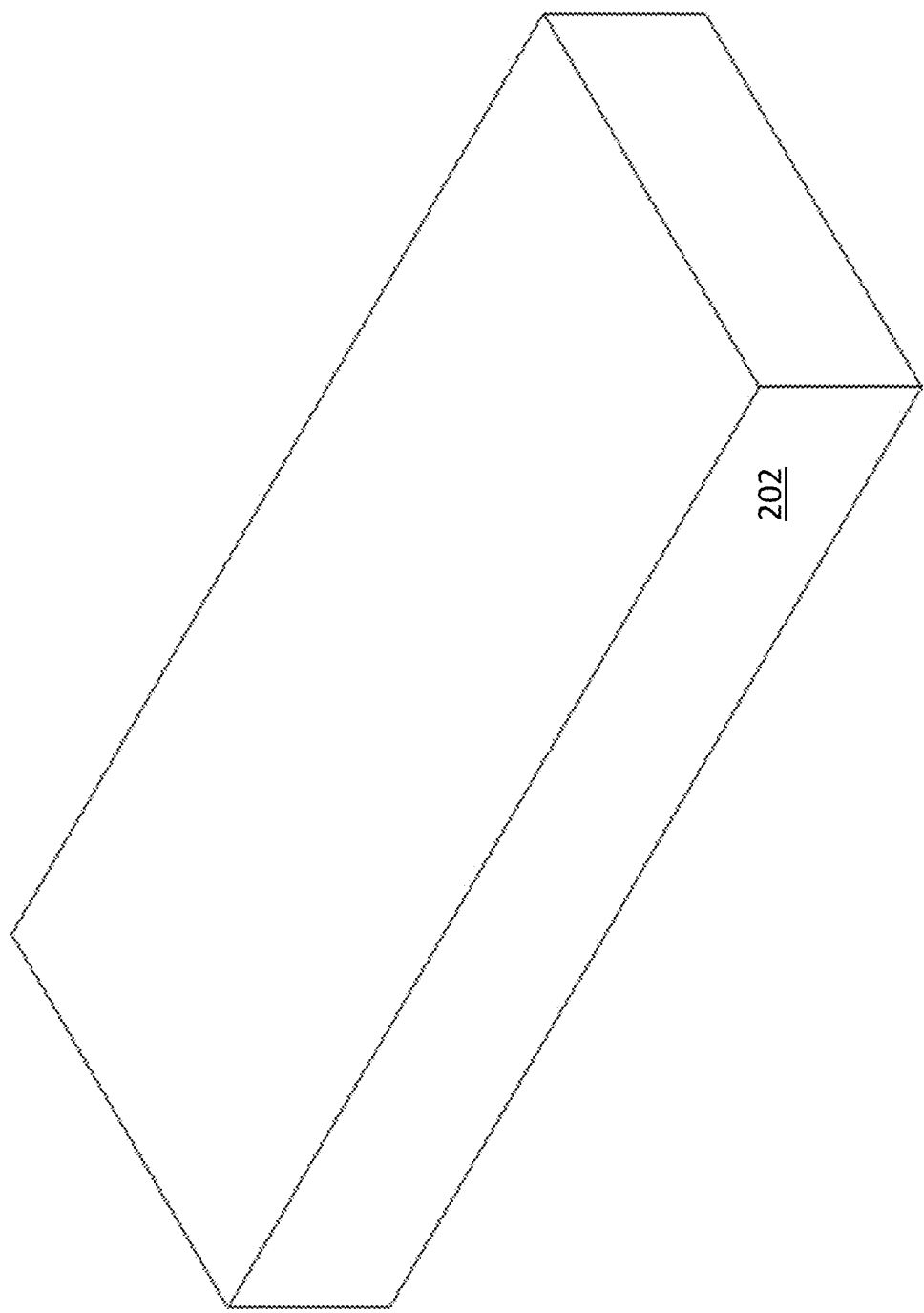
Figure 2B:
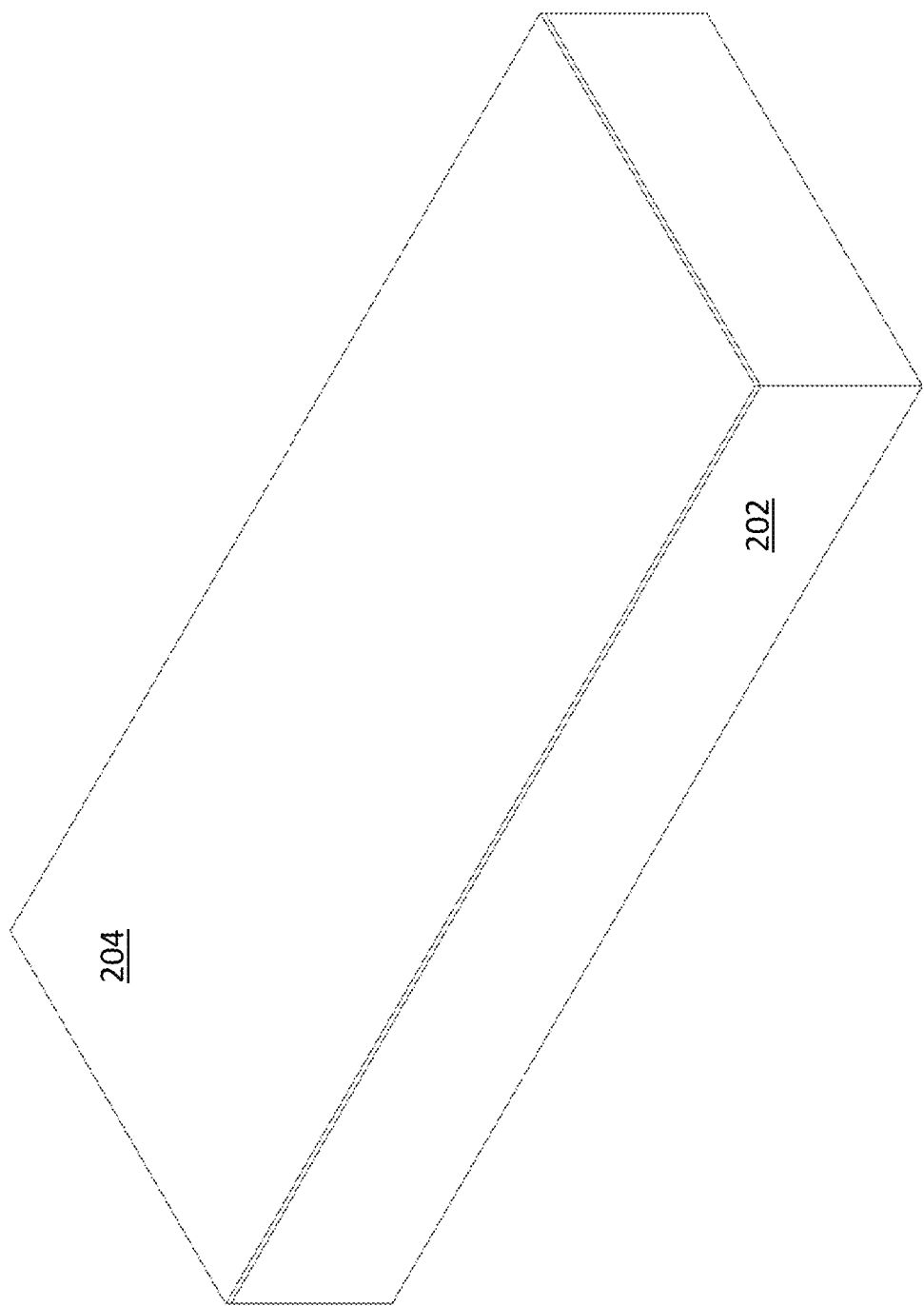
Figure 2C:
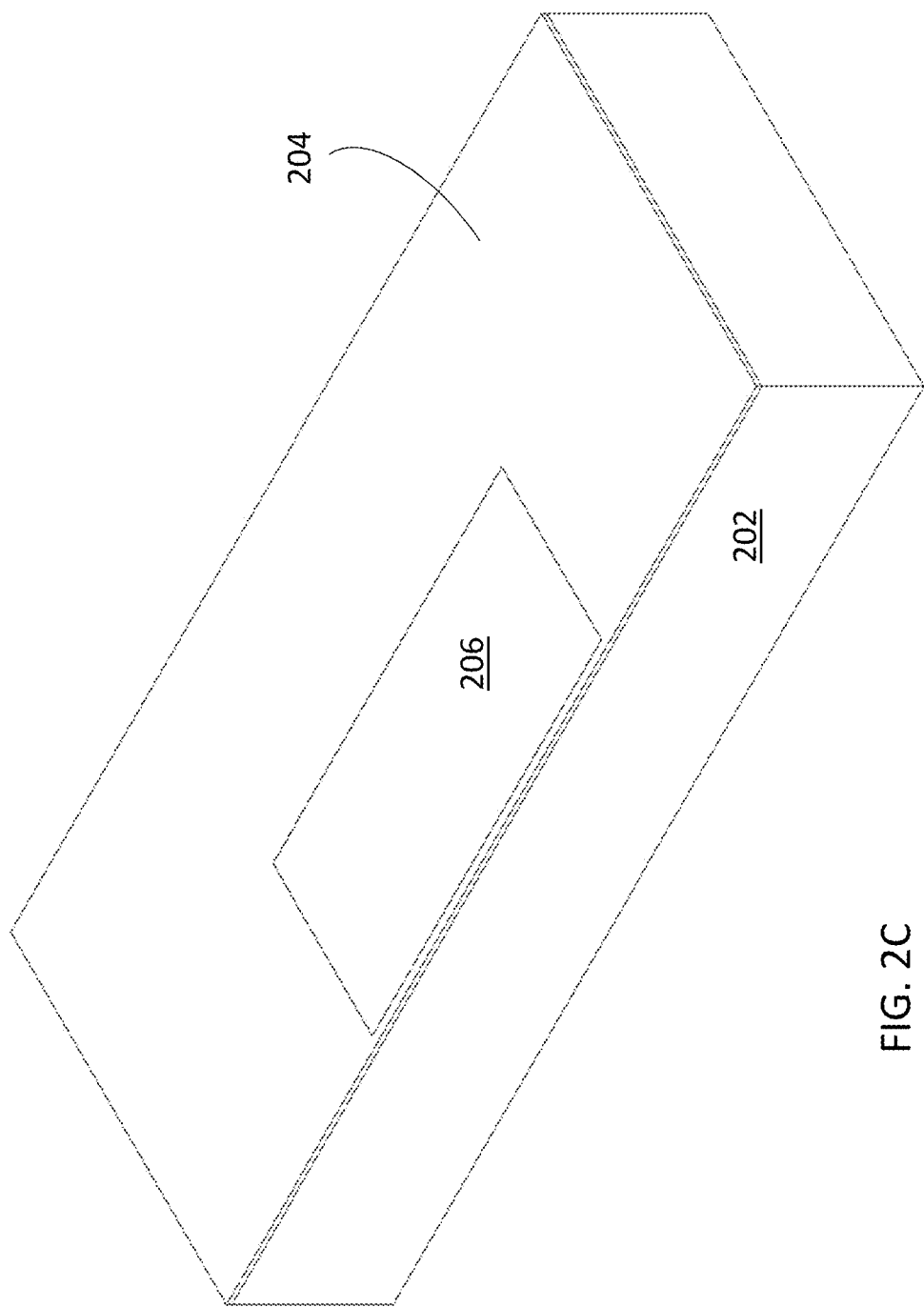
Figure 2D:
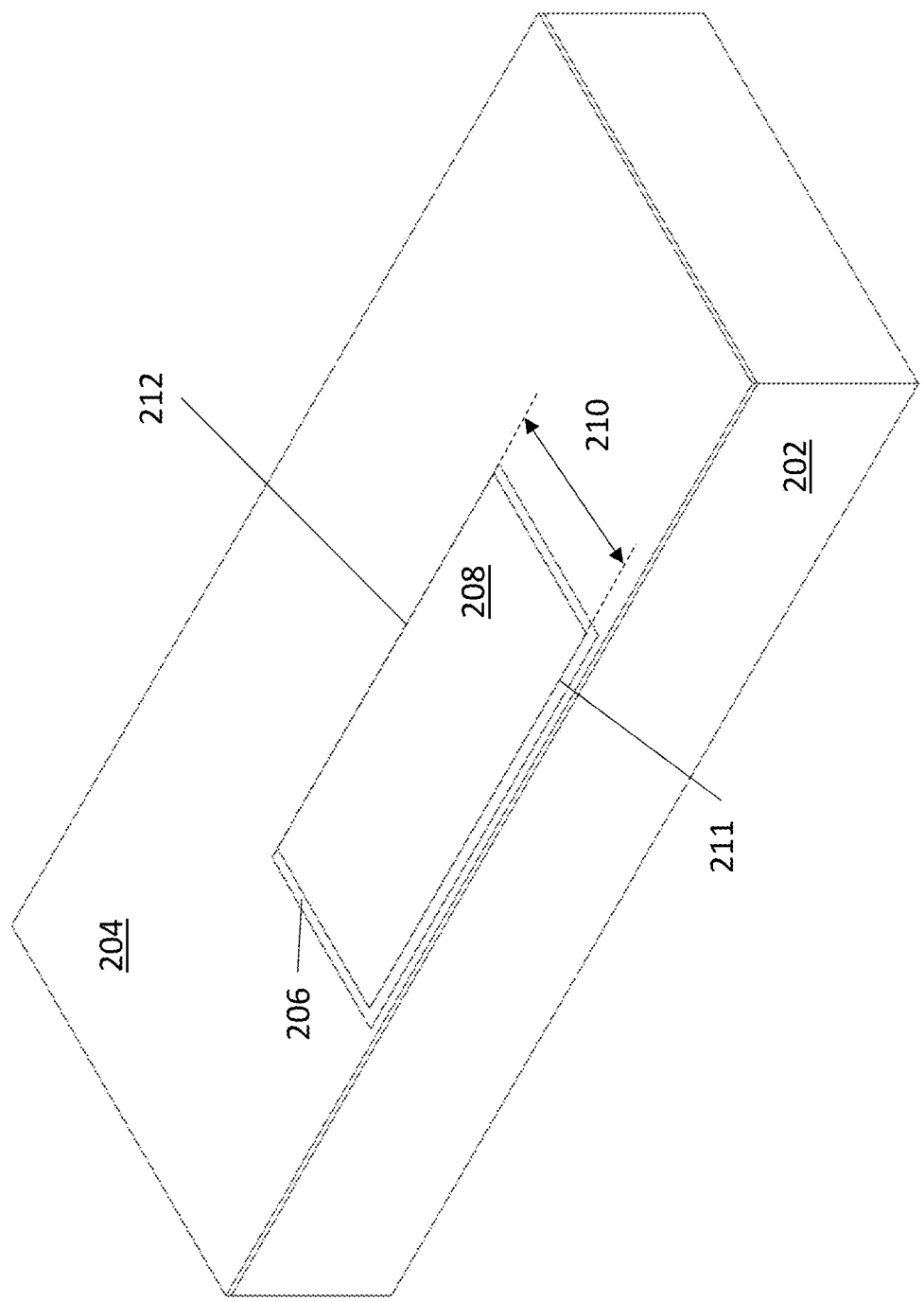
Figure 2E:
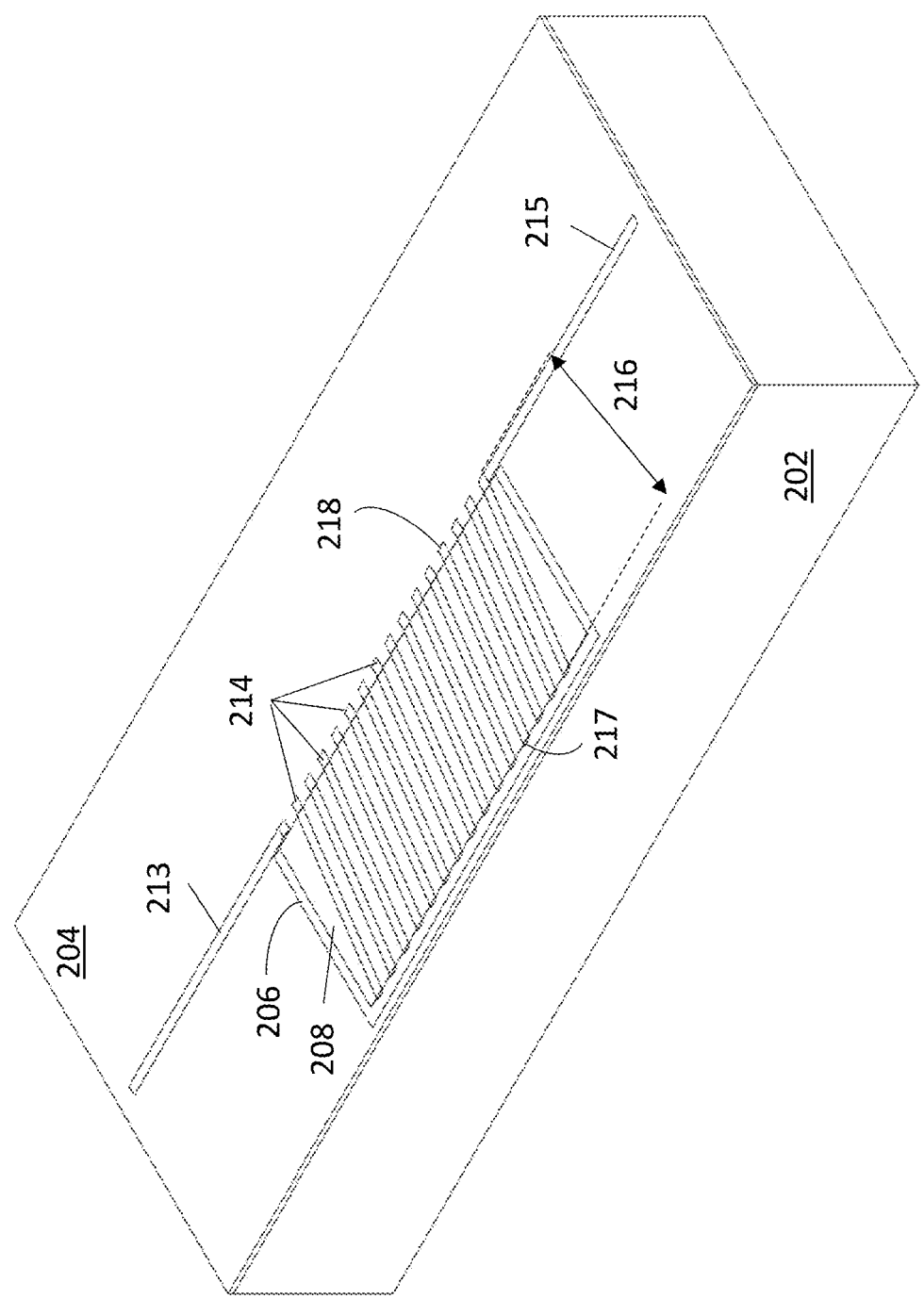
Figure 2F:
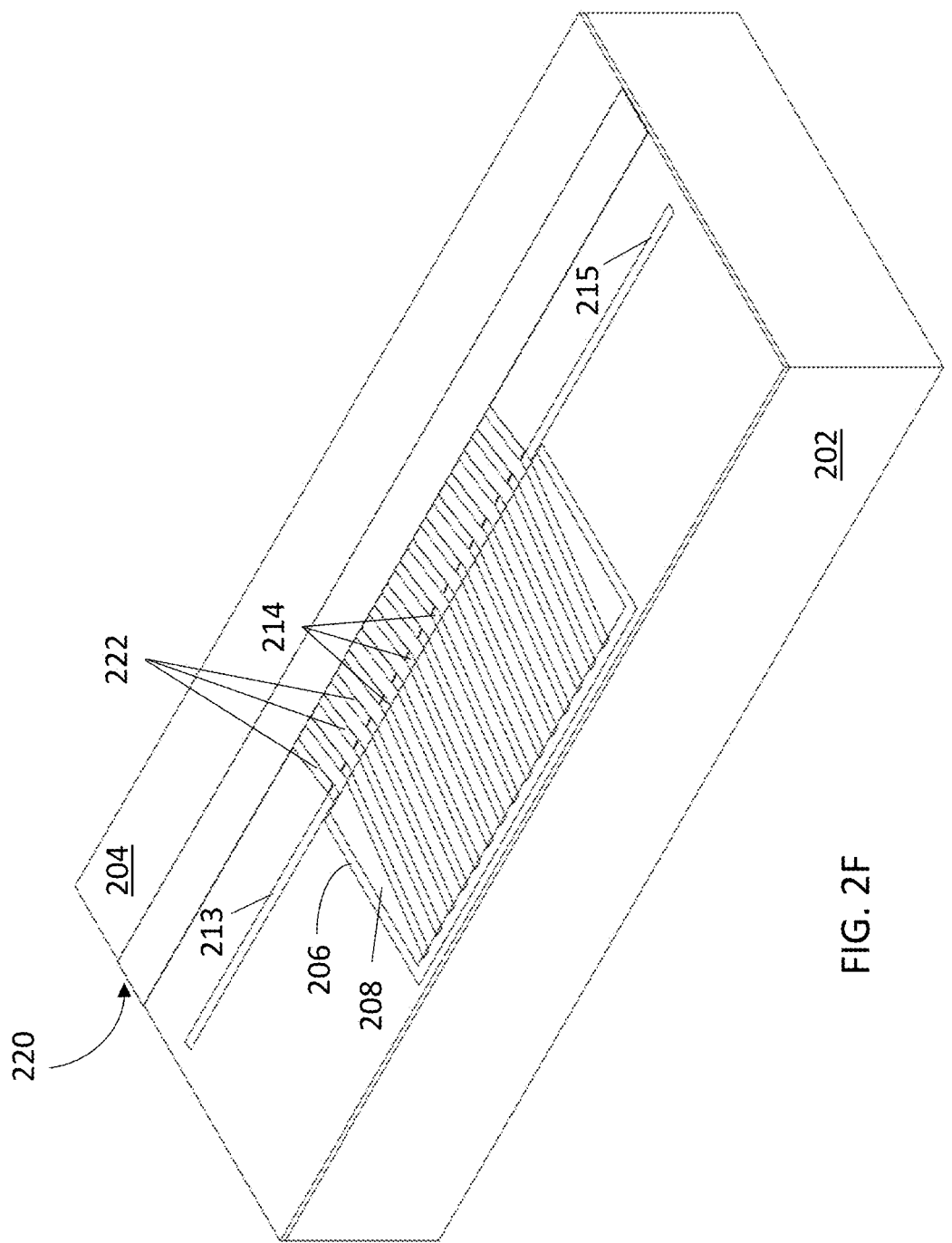
Figure 2G:
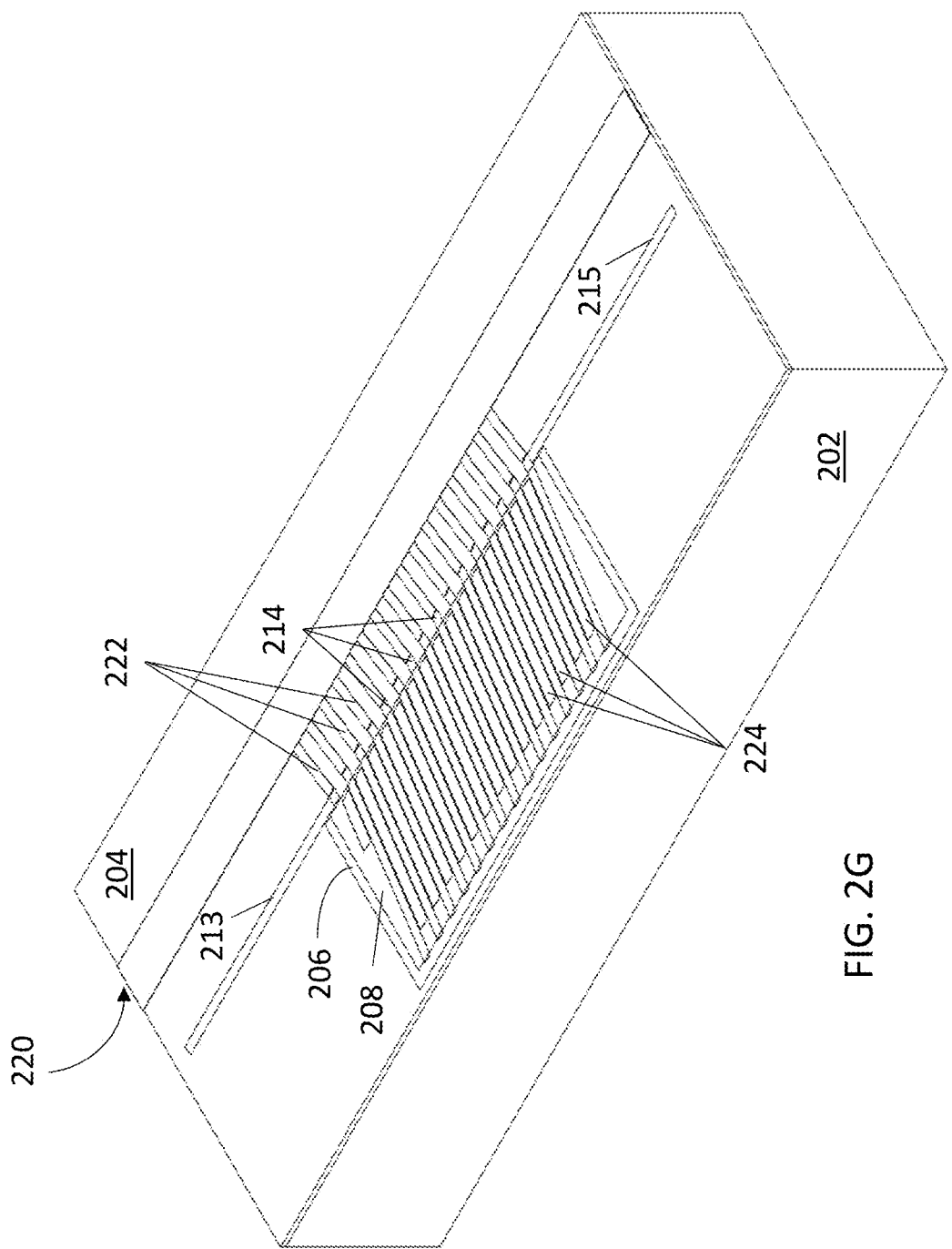
Figure 2H:
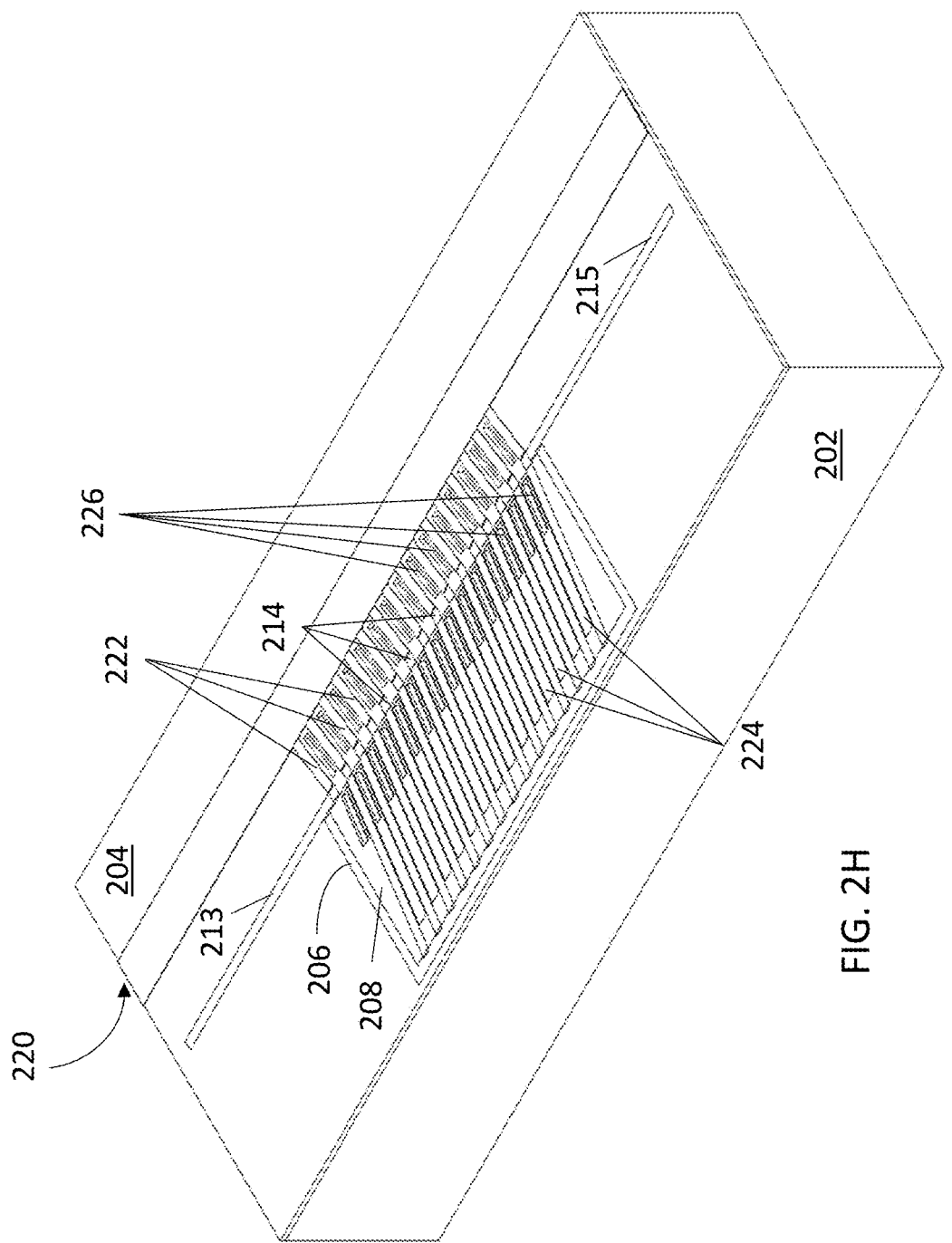
Figure 21:
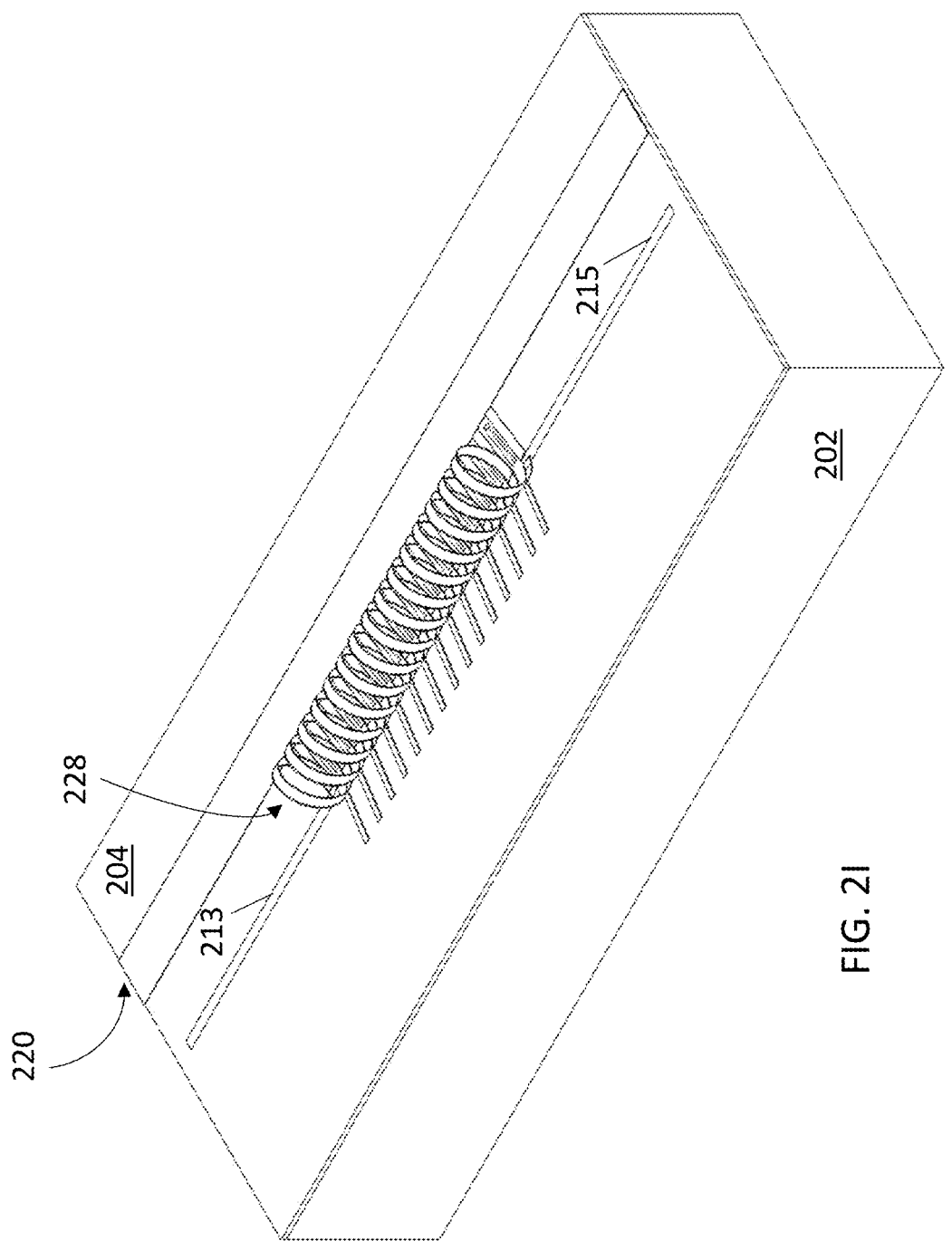
Figure 2J:
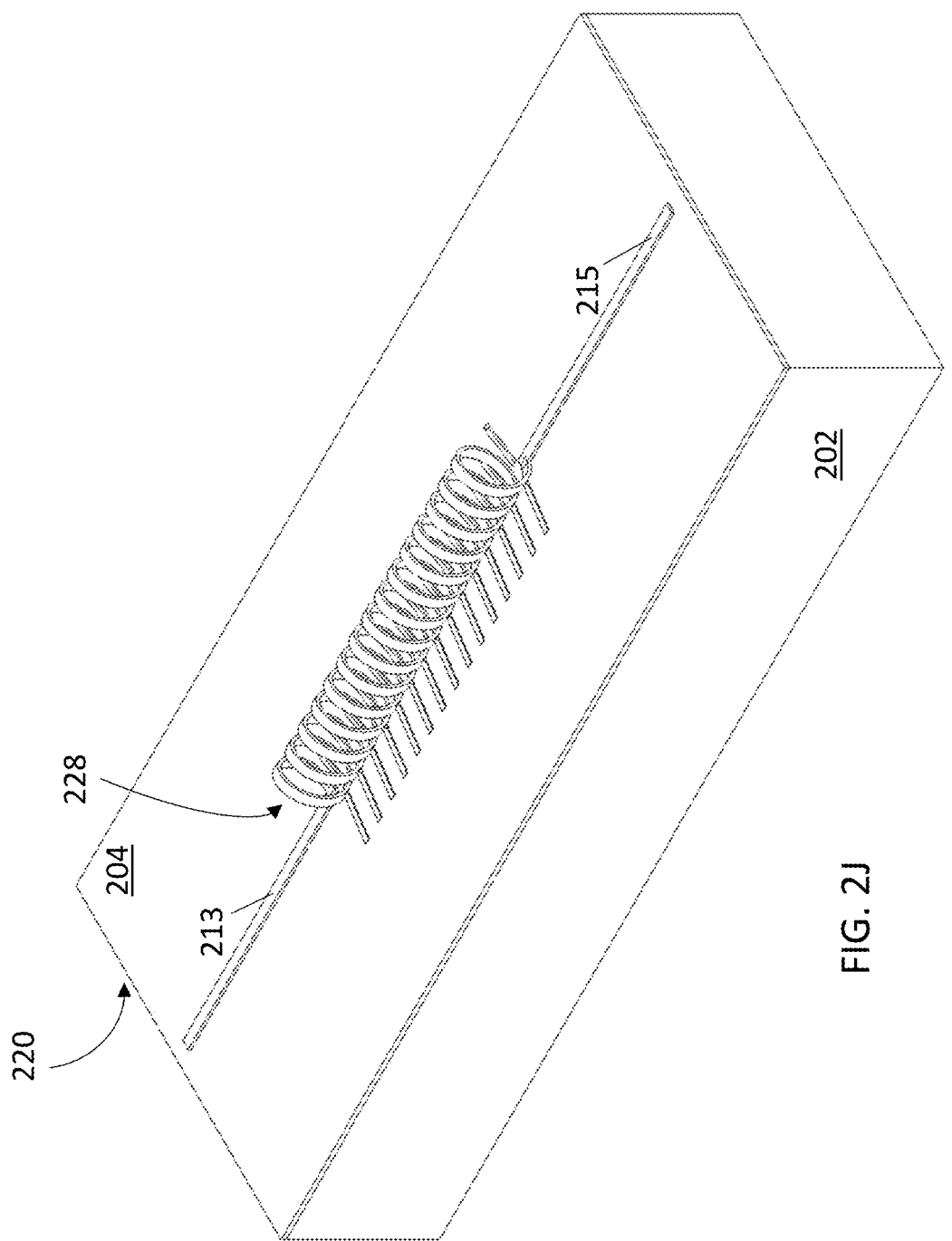
Figure 2K:
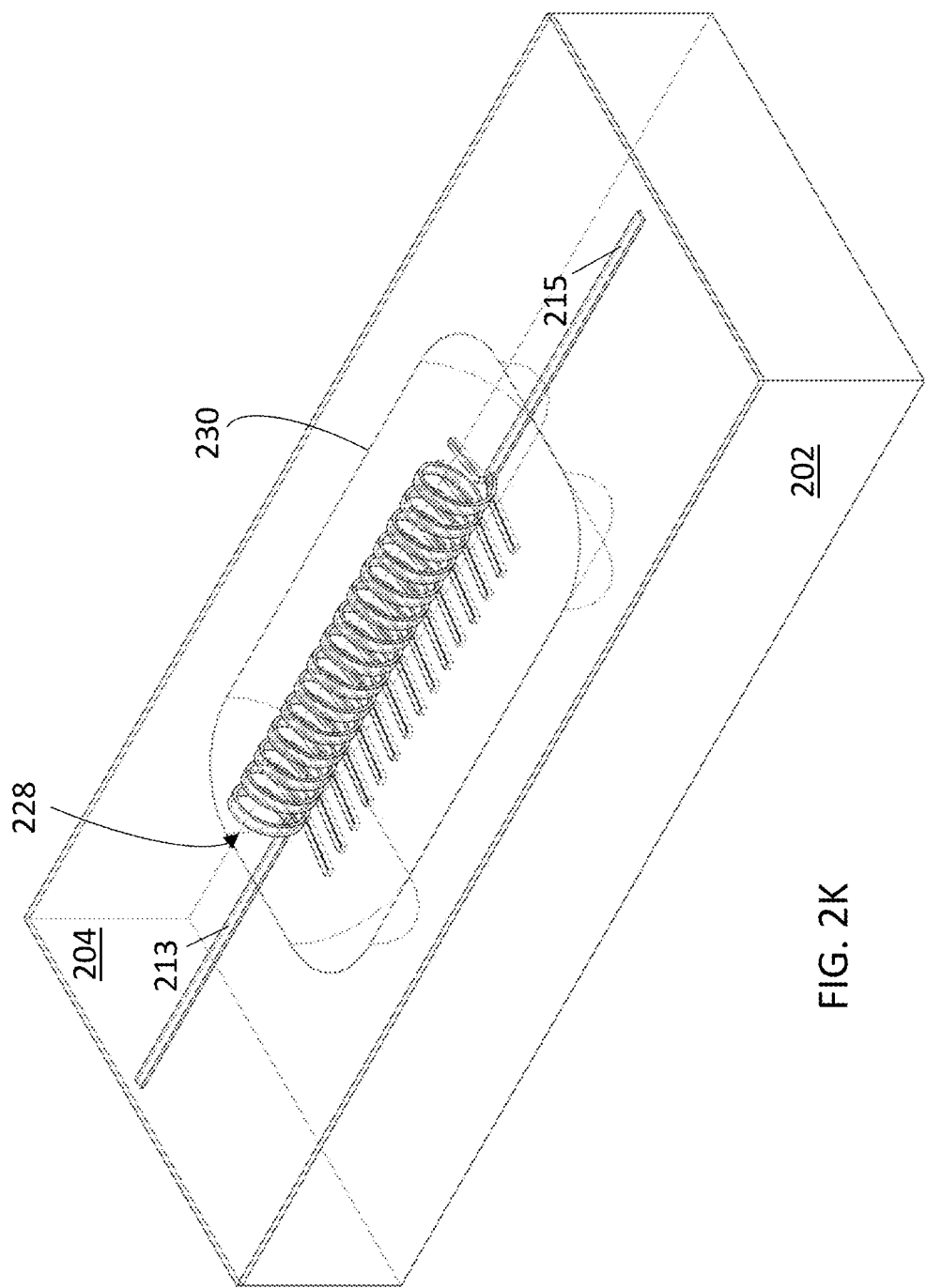

FIGS. 2A-2K illustrate an embodiment of one method of making the SWS for the TWT amplifier of FIG. 1, with a detailed drawing of the final SWS in FIG. 2K. The process begins with a device substrate, as shown in FIG. 2A. If the device substrate 202 is to be retained as part of the final TWT amplifier, it should be composed of a high resistivity material in order to avoid or minimize signal loss, particularly at high frequencies. Alternatively, if device substrate 202 will ultimately be removed from the amplifier, device substrate 202 should be made of a material that is able to be selectively removed from the structure. Silicon is an example of a suitable substrate material because silicon can be made with high resistivity using, for example, the float zone process and because silicon can be selectively etched using known wet or dry etching techniques.

Next, a support membrane 204 is formed on at least a portion of the surface of device substrate 202 (FIG. 2B). Support membrane 204 is so called because support membrane 204 is a relatively thin layer of material that will eventually support the SWS, as described in more detail below. Support membrane 204 is composed of a dielectric, high-resistivity material in order to avoid signal loss. Support membrane 204 can be formed using, for example, chemical vapor deposition, which allows the membrane to be grown to a desired thickness. The thickness of the membrane is not critical, provided that the thickness allows for adequate heat dissipation and structural support. By way of illustration, suitable support membrane thicknesses include those in the range from sub-micron (e.g., 500 nm to 1 µm) up to 20 µm. Optionally, support membrane 204 can be mechanically polished or coated with a smoothing layer, such as spin-on-glass, in order to facilitate the deposition of overlying conductive layers with low surface roughness.

The support membrane is desirably thermally conductive in order to facilitate the dissipation of heat generated by the SWS. However, the requirement for thermal conductivity will depend, at least in part, on the power output of the TWT; a lower power output will generally require a lower thermal conductivity. Diamond and silicon nitride ($Si_3N_4$) are examples of low-loss materials that can be used for the support membrane. Because diamond has a higher thermal conductivity, diamond may be a better choice for high-power applications.

A layer of sacrificial material, referred to herein as a sacrificial film 206, is then formed over at least a portion of the surface of support membrane 204 (FIG. 2C), and a strained scaffold film 208 is formed on at least a portion of the surface of sacrificial film 206 (FIG. 2D). Sacrificial film 206 is so called because sacrificial film 206 will ultimately be selectively removed from the structure, thereby releasing overlying scaffold film 208. Scaffold film 208 is so called because scaffold film 208 is a relatively thin layer of material that self-assembles into a cylindrical support structure (i.e., a scaffold) upon release from sacrificial film 206, as described below. Scaffold film 208 is composed of a dielectric material, which may be, but need not be, the same dielectric material from which support membrane 204 is fabricated and which may be, but need not be, thermally conductive. The selection of the sacrificial film material and the selection of the scaffold film material will be interdependent, as it must be possible to selectively remove (e.g., etch) the sacrificial layer from the structure. Examples of suitable scaffold film materials includes silicon nitride ($Si_3N_4$), silicon oxide (SiO and/or $SiO_2$), aluminum oxide ($Al_2O_3$), and diamond, for which germanium, germanium oxide, silicon, or a photoresist could be used as the sacrificial film material. Germanium and germanium oxide can be selectively removed with $H_2O$ and $H_2O_2$, which dissolve both of these materials. $XeF_2$ can be used for the selective etching of germanium, germanium oxide, and silicon. Photoresists can be selectively removed with acetone.

Scaffold film 208 is characterized by a film length 210 between a leading edge 211 and a trailing edge 212. Film length 210 is chosen such that, upon release from sacrificial film 206, scaffold film 208 relaxes and rolls into a cylindrical tube with leading edge 211 abutting trailing edge 212. However, leading edge 211 need not come into perfect abutment with trailing edge 212; a small amount of edge overlap or a small gap between the leading and trailing edges is permissible. Film length 210 will depend upon the desired diameter of the SWS. The thickness and strain in scaffold film 208 can be tailored to provide the desired SWS diameter for a targeted frequency. By way of illustration only, a diamond scaffold film having a thickness in the range from about 10 nm to about 20 nm grown on a germanium or photoresist sacrificial layer could provide a tube having an inside diameter in the range from about 0.5 µm to about 2 µm. By way of further illustration, a silicon nitride scaffold film having a thickness in the range from about 20 nm to about 40 nm grown on a germanium sacrificial layer could provide a tube having an inside diameter in the range from about 1 µm to about 5 µm and a silicon nitride scaffold film having a thickness of about 250 nm grown on a germanium sacrificial layer could provide a tube having an inside diameter of about 30 µm.

A plurality of parallel electrically conductive strips 214 is then formed on scaffold film 208 (FIG. 2E). The electrically conductive strips will typically be metal strips, such as gold strips. However, other electrically conductive and electroplatable materials, such as copper or silver, can be used. Electrically conductive strips 214 are characterized by a strip length 216 between a leading end 217 and a trailing end 218. Strip length 216 is chosen such that, when scaffold film 208 is rolled into a cylindrical tube, electrically conducting strips 214 are brought into an end-to-end arrangement that forms an electrically conducting helix on the interior surface of the cylindrical tube, as discussed in more detail below. In the end-to-end arrangement, the leading end of each strip desirably abuts or slightly overlaps the trailing end of the neighboring strip, such that each strip forms one turn of the helix. It is acceptable for a small gap to exist between the leading and trailing edges of the strips. Such gaps can be filled by a subsequent electroplating step, as described below. In some embodiments of the TWT amplifiers, trailing ends 218 of electrically conductive strips 214 are attached to support membrane 204, such that the SWS remains tethered to the support membrane along the long edge thereof after the release of scaffold film 208 from sacrificial film 206. Alternatively, trailing edge 212 (FIG. 2D) of scaffold film 208 can be attached to support membrane 204 to tether the SWS to the support membrane.

Electrically conductive strips 214 should be thin enough that electrically conductive strips 214 do not interfere with the rolling of scaffold film 208 upon the release of scaffold film 208 from sacrificial film 206. By way of illustration, electrically conducting strips 214 will typically have thicknesses in the range from 2 nm to 50 nm. The width and pitch of the strips can be selected to provide a helix with the desired EM wave propagating properties. Both the thickness and the width of the strips can be increased by electroplating after the self-assembly of the cylindrical tube.

Electrically conductive contacts 213, 215 can be deposited when electrically conductive strips 214 are deposited. Alternatively, electrically conductive contacts 213, 215 can be formed at an earlier or later stage of the process. Electrically conductive contacts 213, 215 may be composed of the same material as electrically conductive strips 214 or a different material. These contacts 213, 215 can act as the signal input coupler 116 and the signal output coupler 118 as shown in FIG. 1 or they can provide a connection to the signal input and output couplers.

FIG. 2F illustrates a set-up that can be used for the subsequent electroplating of a metal onto the electrically conductive strips 214 in a helix. The set-up includes a patterned plating seed 220 that provides a low-resistance path from a current source to electrically conductive strips 214. In the embodiment shown here, plating seed 220 includes a plurality of contact lines 222 in electrical communication with electrically conductive strips 214. However, plating seed 220 could be placed at different locations on the exposed surface of support membrane 204, provided plating seed 220 does not cover the locations where substrate etch gaps (discussed below) are to be placed. Plating seed is formed from an electrically conductive material, such as aluminum, that can be selectively removed (e.g., etched or dissolved) from support membrane 204. In addition, the outer surface of the material of the plating seed that is in contact with the plating solution (i.e., not the portion of the surface in contact with the conductive strips) is desirably one that is resistant to plating by the metal to be electroplated onto the helix. For example, an aluminum plating seed whose surface in contact with the plating solution may be oxidized to resist plating or a plating seed of another metal, such as copper could be coated with aluminum oxide to resist plating by gold. Virtually any metal can be used, provided the exposed surfaces of the metal are electrically insulated from the plating solution and that both the metal and the electrical insulation of the metal can be selectively removed from the structure after the electroplating process is complete.

Optionally, at least some of sacrificial film 206 and scaffold film 208 can be removed between electrically conductive strips 214 to form electroplating gaps 224 that will allow the electroplating solution to move more freely around the helix during the electroplating process, as illustrated in FIG. 2G. In addition, for embodiments of the TWT amplifiers in which the SWS is to be suspended over device substrate 202, portions of support membrane 204 may be removed between electrically conductive strips 214 and/or contact lines 222 to form etch gaps 226 (FIG. 2H). Etch gaps 226 allow an etchant to selectively etch away the material of device substrate 202 underlying the helix in a subsequent etching step.

Next, sacrificial film 206 is selectively etched to release scaffold film 208, whereby strain release in scaffold film 208 causes scaffold film 208 to roll into a cylinder, bringing electrically conducting strips 214 into an end-to-end arrangement that forms an electrically conductive helix 228 (FIG. 2I) on the interior surface of the cylinder. The strain in scaffold film 208 comprises a biaxial or uniaxial strain gradient across the thickness of the film that causes the film to roll upward. The strain gradient can be imparted to the scaffold film in a variety of ways. For example, sacrificial film 206 can be composed of a material that imparts a compressive strain to a scaffold film that is grown thereon. Alternatively, a thermal-expansion mismatch between sacrificial film 206 and scaffold film 208 could provide the requisite strain gradient. In some embodiments of the devices the strain gradient is engineered into the scaffold film by tailoring the deposition parameters during its growth.

In helix 228, each electrically conductive strip 214 (FIG. 2H) provides one turn of the helix. The formation of the electrically conductive helix 228 is illustrated in FIG. 2I. Scaffold film 208 is not shown in FIG. 2I so that the structure of helix 228 can be seen.

The helix is then electroplated to increase the thickness of the electrically conductive strips from which the helix is constructed and also to fill in any gaps between the leading and trailing ends of the strips to provide a continuous helical structure. Helix 228 can be electroplated with a metal that is the same as, or different from, the metal used to form electrically conductive strips 214. Electroplating is carried out by immersing helix 228 in an electroplating solution and creating a voltage difference between plating seed 220 and a counter electrode (not shown) to induce metal ions in the electroplating solution to deposit onto the surface of helix 228.

Increasing the thickness of the helix via electroplating may provide better heat transfer and lower signal loss for the TWT amplifier and also allows for the tailoring of the signal propagating properties (e.g., operating frequencies) of the SWS, whereby smaller inner-diameter wave tubes amplify higher-frequency signals. By way of illustration only, the plating material can be deposited to thicknesses of up to 10 µm or even greater, including plating material thicknesses in the range from 30 nm to 10 µm. Using the self-assembly and electroplating processes described herein, SWSs capable of amplifying terahertz signals with frequencies in the range from 0.3 THz to 3 THz can be fabricated. Once the electroplating is completed, plating seed 220 can be removed (FIG. 2J). If the electroplating seed is made from aluminum, this can be accomplished by etching in a piranha solution or commercially available aluminum etchants.

Optionally, device substrate 202 can be partially or entirely removed from the TWT amplifier using, for example, a mechanical polish, wet or dry etching, or a combination thereof. Removing device substrate 202 can be advantageous because doing so reduces dielectric loading and increases interaction impedance, which increases the gain of the TWT amplifier. FIG. 2K shows an embodiment of a TWT amplifier in which the device substrate material disposed beneath the SWS is removed by etching through etch gaps 226 (FIG. 2H). This creates a suspended area 230 in support membrane 204 on which the scaffold tube and helix 228 are supported. In embodiments of the TWT amplifier in which the device substrate is silicon or silicon nitride and the support membrane is diamond, a $XeF_2$ etch can be used to selectively remove the substrate.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A traveling wave tube amplifier comprising:
a slow-wave structure comprising:
a cylindrical scaffold comprising a dielectric film, the cylindrical scaffold having an interior surface; and
an electrically conductive helix on the interior surface of the cylindrical scaffold, the electrically conductive helix comprising a plurality of electrically conductive strips connected end-to-end;
an electron gun positioned to direct one or more beams of electrons axially through the electrically conductive helix or around the periphery of the electrically conductive helix; and
an electron collector positioned opposite the electron gun.

2. The amplifier of claim 1, wherein the cylindrical scaffold comprises silicon nitride, silicon oxide, aluminum oxide, or diamond.

3. The amplifier of claim 1, wherein the electrically conductive helix has an inner diameter in the range from 1 μm to 50 μm.

4. The amplifier of claim 1, wherein each electrically conductive strip corresponds to one coil of the electrically conductive helix.

5. The amplifier of claim 1, further comprising a dielectric support membrane, wherein the slow-wave structure is attached to the dielectric support membrane along the length of the slow-wave structure.

6. The amplifier of claim 5, wherein the dielectric support membrane comprises diamond or silicon nitride.

7. The amplifier of claim 6, wherein the electrically conductive helix comprises a material that can be electroplated.

8. The amplifier of claim 7, wherein the electrically conductive helix comprises gold, copper, nickel, or silver.

9. The amplifier of claim 8, wherein the cylindrical scaffold comprises silicon nitride, the dielectric support membrane comprises diamond, and the electrically conductive helix comprises gold.

10. The amplifier of claim 8, wherein the electrically conductive helix has an inner diameter in the range from 1 μm to 50 μm.

11. The amplifier of claim 5, further comprising a device substrate, wherein the portion of the dielectric support membrane to which the slow-wave structure is attached is suspended over the device substrate.

12. The amplifier of claim 1, wherein the cylindrical scaffold comprises diamond, has a thickness in the range from 10 nm to 20 nm, and has an inside diameter in the range from 0.5 μm to 2 μm.

13. The amplifier of claim 1, wherein the cylindrical scaffold comprises silicon nitride, has a thickness in the range from 20 nm to 40 nm, and has an inside diameter in the range from 1 μm to 5 μm.

14. The amplifier of claim 1, wherein the cylindrical scaffold has an inside diameter in the range from 0.5 μm to 30 μm.

* * * * *